(12) United States Patent
Sasaki et al.

(10) Patent No.: US 10,840,002 B2
(45) Date of Patent: Nov. 17, 2020

(54) SPIN CURRENT MAGNETIZATION ROTATIONAL ELEMENT, MAGNETORESISTANCE EFFECT ELEMENT, MAGNETIC MEMORY, AND HIGH-FREQUENCY MAGNETIC ELEMENT

(71) Applicant: TDK CORPORATION, Tokyo (JP)

(72) Inventors: Tomoyuki Sasaki, Tokyo (JP); Yugo Ishitani, Tokyo (JP); Keita Suda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/101,949

(22) Filed: Aug. 13, 2018

(65) Prior Publication Data

US 2019/0074123 A1   Mar. 7, 2019

(30) Foreign Application Priority Data

Sep. 5, 2017   (JP) .................................. 2017-170368

(51) Int. Cl.
*H01F 10/32* (2006.01)
*G11C 11/16* (2006.01)
(Continued)

(52) U.S. Cl.
CPC .......... *H01F 10/329* (2013.01); *G11C 11/161* (2013.01); *G11C 11/1675* (2013.01);
(Continued)

(58) Field of Classification Search
CPC . H01L 43/00–14; H01L 27/22; H01L 27/222; G11C 11/16; G11C 11/161; H01F 10/3254; H01F 10/3286; H01F 10/329
(Continued)

(56) References Cited

U.S. PATENT DOCUMENTS

| 8,350,347 B2 | 1/2013 | Gaudin et al. |
| 2008/0074802 A1 | 3/2008 | Carey et al. |

(Continued)

FOREIGN PATENT DOCUMENTS

WO   2016/021468 A1   2/2016

OTHER PUBLICATIONS

Ioan Mihai Miron et al. "Perpendicular Switching of a Single Ferromagnetic Layer Induced by In-Plane Current Injection". Nature, Aug. 11, 2011, vol. 476, pp. 189-194.
(Continued)

*Primary Examiner* — Mohammed Shamsuzzaman
*Assistant Examiner* — Aaron J Gray
(74) *Attorney, Agent, or Firm* — Oliff PLC

(57) ABSTRACT

Provided is a spin current magnetization rotational element including: a spin-orbit torque wiring that extends in a first direction and is configured to generate a spin current; a first ferromagnetic layer that is laminated in a second direction intersecting the spin-orbit torque wiring and is configured for magnetization direction to be changed; and a first perpendicular magnetic field applying layer that is disposed to be separated from the spin-orbit torque wiring and the first ferromagnetic layer, the first perpendicular magnetic field applying layer being configured to apply an assistant magnetic field assisting a magnetization rotation of the first ferromagnetic layer.

4 Claims, 9 Drawing Sheets

(51) Int. Cl.
  *H01L 43/02* (2006.01)
  *H01L 43/06* (2006.01)
  *H01L 43/08* (2006.01)
  *H01L 43/10* (2006.01)
  *H01L 27/22* (2006.01)
  *H03H 11/04* (2006.01)
  *H03H 2/00* (2006.01)

(52) U.S. Cl.
  CPC ..... *H01F 10/3254* (2013.01); *H01F 10/3286* (2013.01); *H01L 27/222* (2013.01); *H01L 43/02* (2013.01); *H01L 43/06* (2013.01); *H01L 43/08* (2013.01); *H03H 11/04* (2013.01); *H01L 43/10* (2013.01); *H03H 2/00* (2013.01)

(58) Field of Classification Search
  USPC .............. 257/421, E29.323, E21.665; 438/3; 365/158, 171
  See application file for complete search history.

(56) References Cited

U.S. PATENT DOCUMENTS

| | | | |
|---|---|---|---|
| 2009/0034131 | A1 | 2/2009 | Yamada et al. |
| 2009/0140733 | A1 | 6/2009 | Koga et al. |
| 2010/0091555 | A1* | 4/2010 | Fukami ................ B82Y 10/00 365/158 |
| 2012/0281467 | A1* | 11/2012 | Abraham ............ G11C 11/1675 365/171 |
| 2015/0084972 | A1 | 3/2015 | Wu et al. |
| 2015/0348606 | A1 | 12/2015 | Buhrman et al. |
| 2016/0247550 | A1* | 8/2016 | Fukami ................ H01L 43/02 |
| 2016/0300999 | A1* | 10/2016 | Yi ....................... G11C 11/1675 |
| 2017/0222135 | A1* | 8/2017 | Fukami ................ H01L 27/105 |
| 2019/0074123 | A1 | 3/2019 | Sasaki et al. |

OTHER PUBLICATIONS

S. Fukami et al. "A Spin-Orbit Torque Switching Scheme With Collinear Magnetic Easy Axis and Current Configuration". Nature Nanotechnology, Mar. 21, 2016, pp. 1-6.

Guoqiang Yu et al. "Switching of Perpendicular Magnetization by Spin-Orbit Torques in the Absence of External Magnetic Fields". Nature Nanotechnology, May 11, 2014, pp. 548-554.

Y.K. Kato et al. "Observation of the Spin Hall Effect in Semiconductors". Science, Dec. 10, 2004, vol. 306, pp. 1910-1913.

Luqiao Liu et al. "Spin Torque Switching With the Giant Spin Hall Effect of Tantalum". Science, Mar. 13, 2012, pp. 1-19.

Luqiao Liu et al. "Current-Induced Switching of Perpendicularly Magnetized Magnetic Layers Using Spin Torque From the Spin Hall Effect". Physical Review Letters, Aug. 31, 2012, vol. 109. pp. 096602-1 through 096602-5.

Ki-Seung Lee et al. "Threshold Current for Switching of a Perpendicular Magnetic Layer Induced by Spin Hall Effect". Applied Physics Letters, 2013, vol. 102, pp. 112410-1 through 112410-5.

Ki-Seung Lee et al. "Thermally Activated Switching of Perpendicular Magnet by Spin-Orbit Spin Torque". Applied Physics Letters, 2014, vol. 104, pp. 072413-1 through 072413-5.

Shunsuke Fukami et al. "Magnetization Switching by Spin-Orbit Torque in an Antiferromagnet-Ferromagnet Bilayer System". Nature Materials, May 2016, vol. 15, pp. 535-542.

S. Takahashi et al. "Spin Injection and Detection in Magnetic Nanostructures". Physical Review B, 2003, vol. 67, pp. 052409-1 through 052409-4.

Yeongkyo Seo et al. "Area-Efficient SOT-MRAM WTH a Schottky Diode". IEEE Electron Device Letters, Aug. 2016, vol. 37, No. 8, pp. 982-985.

Wei Zhang et al. "Spin Hall Effects in Metallic Antiferromagnets". Physical Review Letters, Nov. 7, 2014, vol. 113, pp. 196602-1 through 196602-6.

Nov. 6, 2019 Office Action issued in U.S. Appl. No. 16/110,846.

* cited by examiner

SPIN CURRENT MAGNETIZATION ROTATIONAL ELEMENT, MAGNETORESISTANCE EFFECT ELEMENT, MAGNETIC MEMORY, AND HIGH-FREQUENCY MAGNETIC ELEMENT

BACKGROUND

The present disclosure relates to a spin current magnetization rotational element, a magnetoresistance effect element, a magnetic memory, and a high-frequency magnetic element.

Priority is claimed on Japanese Patent Application No. 2017-170368, filed on Sep. 5, 2017, the content of which is incorporated herein by reference.

DESCRIPTION OF RELATED ART

A giant magnetoresistance (GMR) element constituted of a multilayer film having a ferromagnetic layer and a nonmagnetic layer, and a tunneling magnetoresistance (TMR) element using an insulating layer (tunnel barrier layer, barrier layer) as a nonmagnetic layer are known as a magnetoresistance effect element. Generally, the element resistance of a TMR element is higher than that of a GMR element, but it is advantageous that the magnetoresistance (MR) ratio thereof be higher than that of a GMR element. Therefore, a TMR element has attracted attention as an element for a magnetic sensor, a high-frequency component, a magnetic head, and a nonvolatile magnetic random access memory (MRAM).

An MRAM reads and writes data utilizing the characteristics that the element resistance of a TMR element changes when orientations of magnetizations of two ferromagnetic layers sandwiching an insulating layer therebetween change. As a writing method of an MRAM, a writing method utilizing a magnetic field made by a current (magnetization rotation), and a writing method utilizing a spin-transfer torque (STT) caused when a current flows in a lamination direction of a magnetoresistance effect element (magnetization rotation) are known.

A magnetization rotation of a TMR element using an STT is efficient when considered from the viewpoint of efficiency in energy. However, it has been reported that the rotational current density required to cause a magnetization rotation is high.

It is desirable that the rotational current density be low from the viewpoint of extending the life of a TMR element. The same applies to a GMR element as well.

Recently, a magnetization rotation utilizing a pure spin current generated through spin orbit interaction as means of reducing a rotational current has attracted attention (for example, I. M. Miron, K. Garello, G. Gaudin, P.-J. Zermatten, M. V. Costache, S. Auffret, S. Bandiera, B. Rodmacq, A. Schuhl, and P. Gambardella, Nature, Vol 476, 189 (2011)). However, a pure spin current caused due to the spin orbit interaction, and the Rashba effect at the interface between different materials induces a spin-orbit torque (SOT), and a magnetization rotation due to a SOT is caused. The detailed mechanisms thereof have not been elucidated so far. A pure spin current is generated when the same number of electrons of an upward spin and electrons of a downward spin flow in orientations opposite to each other, and a flow of electric charge is offset. Therefore, a current flowing in a magnetoresistance effect element is zero, and an extended life for the magnetoresistance effect element is expected when using a spin-orbit torque (SOT).

On the other hand, it is said that a magnetization rotation using an SOT needs to disrupt the symmetry of a magnetization causing a magnetization rotation, by applying an external magnetic field (for example, S. Fukami, T. Anekawa, C. Zhang, and H. Ohno, Nature Nanotechnology, DOI: 10. 1038/NNANO. 2016. 29). In order to apply an external magnetic field, a generation source for an external magnetic field is required. A generation source for an external magnetic field provided separately outside leads to deterioration in degree of integration of an integrated circuit including a spin current magnetization rotational element. Therefore, a technique of enabling a magnetization rotation using an SOT without applying an external magnetic field is also being studied.

For example, Guoqiang Yu, et al., Nature Nanotechnology, DOI: 10. 1038/NNANO. 2014. 94 discloses that the symmetry of the intensity of a magnetization collapses due to changing of the oxygen content of an oxide film bonded to a ferromagnetic material causing a magnetization rotation. When the symmetry of the intensity of a magnetization collapses, a magnetization rotation is likely to occur, so that a magnetization rotation using an SOT can be performed even if there is no magnetic field.

SUMMARY

However, a method disclosed in Guoqiang Yu, et al., Nature Nanotechnology, DOI: 10. 1038/NNANO. 2014. 94 has a problem in that it is difficult to control the oxygen content. Particularly, in each of elements manufactured in a thin-film process, it is difficult to form oxygen content gradients similar to each other for the elements in mass production. In addition, if the magnitude of magnetic anisotropy differs in an in-plane direction of a magnetoresistance effect element, when an unintended external force (external magnetic field, heat, and the like) is applied, there are cases in which a magnetization of a portion having little magnetic anisotropy rotates. A rotation of an unintended magnetization becomes noise in data and hinders long-term storage of data. Particularly, in a case in which the size of a ferromagnetic material of a magnetoresistance effect element is a size which can form a magnetic wall, a magnetization rotation of a portion having little magnetic anisotropy also induces a magnetization rotation of other portions. Accordingly, there is concern that data may be rewritten.

In addition, as a structure for disrupting the symmetry of a magnetization causing a magnetization rotation, it is conceivable to employ a structure in which a wiring is formed inside a circuit forming an element and a magnetic field assisting a magnetization rotation is generated from the wiring. However, when a structure assisting a magnetization rotation by utilizing a wiring is employed, there is problem that more electricity is consumed due to the wiring and the degree of integration of a circuit deteriorates in order to form the wiring.

The present disclosure has been made in consideration of the foregoing problems, and an object thereof is to provide a spin current magnetization rotational element which is configured to be able to induce a magnetization rotation without causing an increase in consumption of electricity and a spin current magnetization rotational element which does not cause deterioration in degree of integration.

In addition, another object of the present disclosure is to provide a magnetoresistance effect element including this excellent spin current magnetization rotational element, a magnetic memory, and a high-frequency magnetic element.

In order to solve the problems described above, the present disclosure provides the following means.

(1) According to an aspect, there is provided a spin current magnetization rotational element including: a spin-orbit torque wiring that extends in a first direction and is configured to generate a spin current; a first ferromagnetic layer that is laminated in a second direction intersecting the spin-orbit torque wiring and is configured for magnetization direction to be changed; and a first perpendicular magnetic field applying layer that is disposed to be separated from the spin-orbit torque wiring and the first ferromagnetic layer, the first perpendicular magnetic field applying layer being configured to apply an assistant magnetic field assisting a magnetization rotation of the first ferromagnetic layer.

(2) The spin current magnetization rotational element according to the aspect described above may employ a configuration in which an axis of easy magnetization of the first ferromagnetic layer is in the first direction.

(3) The spin current magnetization rotational element according to the aspect described above may employ a configuration in which an axis of easy magnetization of the first perpendicular magnetic field applying layer is in the second direction, and a magnetic flux generated by the first perpendicular magnetic field applying layer has at least a component in the second direction.

(4) The spin current magnetization rotational element according to the aspect described above may employ a configuration in which the first perpendicular magnetic field applying layer is electrically separated from the first ferromagnetic layer.

(5) According to another aspect of the present disclosure, there is provided a spin current magnetization rotational element including: a spin-orbit torque wiring that extends in a first direction and is configured to generate a spin current; a first ferromagnetic layer that is laminated in a second direction intersecting the spin-orbit torque wiring and is configured for magnetization direction to be changed; and a first perpendicular magnetic field applying layer that has insulating properties, is disposed to come into contact with the spin-orbit torque wiring at a position sandwiching the spin-orbit torque wiring between the first perpendicular magnetic field applying layer and the first ferromagnetic layer in the second direction intersecting the spin-orbit torque wiring, and is configured to apply an assistant magnetic field assisting a magnetization rotation of the first ferromagnetic layer.

(6) The spin current magnetization rotational element according to the aspect described above may employ a configuration in which the spin-orbit torque wiring is disposed between the first ferromagnetic layer and the first perpendicular magnetic field applying layer.

(7) The spin current magnetization rotational element according to the aspect described above may employ a configuration in which a surface area of the first perpendicular magnetic field applying layer is larger than a surface area of the first ferromagnetic layer.

(8) The spin current magnetization rotational element according to the aspect described above may employ a configuration in which a second perpendicular magnetic field applying layer is disposed on a side opposite to a side on which the first perpendicular magnetic field applying layer is disposed with respect to the spin-orbit torque wiring, and an orientation of a magnetization in the first perpendicular magnetic field applying layer and an orientation of a magnetization in the second perpendicular magnetic field applying layer coincide with each other.

(9) The spin current magnetization rotational element according to the aspect described above may employ a configuration in which a magnetic shield layer is provided on an outer side of the first ferromagnetic layer along the second direction when only the first perpendicular magnetic field applying layer is provided, and the magnetic shield layer is provided on an outer side of at least one of the first perpendicular magnetic field applying layer and the second perpendicular magnetic field applying layer along the second direction when the first perpendicular magnetic field applying layer and the second perpendicular magnetic field applying layer are provided.

(10) The spin current magnetization rotational element according to the aspect described above may employ a configuration in which a value of a film thickness of the spin-orbit torque wiring is a value smaller than a value of a spin diffusion length of the spin-orbit torque wiring.

(11) The spin current magnetization rotational element according to the aspect described above may employ a configuration in which a film thickness of the first perpendicular magnetic field applying layer is greater than a film thickness of the second perpendicular magnetic field applying layer.

(12) The spin current magnetization rotational element according to the aspect described above may employ a configuration in which the first perpendicular magnetic field applying layer and the second perpendicular magnetic field applying layer are displaced along a third direction orthogonal to the first direction and the second direction.

(13) According to another aspect of the present disclosure, there is provided a spin-orbit-torque magnetoresistance effect element including the spin current magnetization rotational element according to any one of the foregoing aspects; a second ferromagnetic layer that is formed to come into contact with a surface on a side opposite to a side which comes into contact with the spin-orbit torque wiring in the first ferromagnetic layer, and is configured for magnetization direction to be fixed; and a nonmagnetic layer that is sandwiched by the first ferromagnetic layer and the second ferromagnetic layer.

(14) According to another aspect of the present disclosure, there is provided a spin-orbit-torque magnetoresistance effect element including: the above-described spin current magnetization rotational element; a second ferromagnetic layer that is formed to come into contact with a surface on a side opposite to a side which comes into contact with the spin-orbit torque wiring in the first ferromagnetic layer, and is configured for magnetization direction to be fixed; and a nonmagnetic layer that is sandwiched by the first ferromagnetic layer and the second ferromagnetic layer.

(15) According to another aspect of the present disclosure, there is provided a high-frequency magnetic element including the above-described spin-orbit-torque magnetoresistance effect element.

According to the spin current magnetization rotational element of the aspect described above, it is possible to provide a spin current magnetization rotational element which can perform a magnetization rotation without increasing consumption of electricity and in which deterioration in degree of integration is not caused. In addition, it is possible to provide a magnetoresistance effect element including such an excellent spin current magnetization rotational element, a magnetic memory, and a high-frequency magnetic element.

BRIEF DESCRIPTION OF THE DRAWINGS

FIG. 9(a) is a cross-sectional view of a portion illustrating a state in which layers which become a base of a first perpendicular magnetic field applying layer are formed on a substrate and are subjected to perpendicular magnetization annealing. FIG. 9(b) is a cross-sectional view of a portion illustrating a state in which the first perpendicular magnetic field applying layer is shaped. FIG. 9(c) is a cross-sectional view of a portion illustrating a state in which an insulating layer is provided around the shaped layer. FIG. 9(d) is a cross-sectional view of a portion illustrating a state in which a part of an insulating layer is subjected to CMP polishing. FIG. 9(e) is a cross-sectional view of a portion illustrating a state in which layers which become bases of a magnetoresistance effect element and a spin-orbit torque wiring are laminated. FIG. 9(f) is a cross-sectional view of a portion illustrating a state in which a main part of the magnetoresistance effect element is formed. FIG. 9(g) is a schematic plan view illustrating the state of FIG. 9(f). FIG. 9(h) is a cross-sectional view of a portion illustrating a state in which a spin-orbit torque wiring is formed. FIG. 9(i) is a schematic plan view illustrating the state of FIG. 9(h). FIG. 9(j) is a cross-sectional view of a portion illustrating a state in which a contact layer is formed. FIG. 9(k) is a schematic plan view illustrating the state of FIG. 9(j).

DETAILED DESCRIPTION OF THE INVENTION

Figure 1:
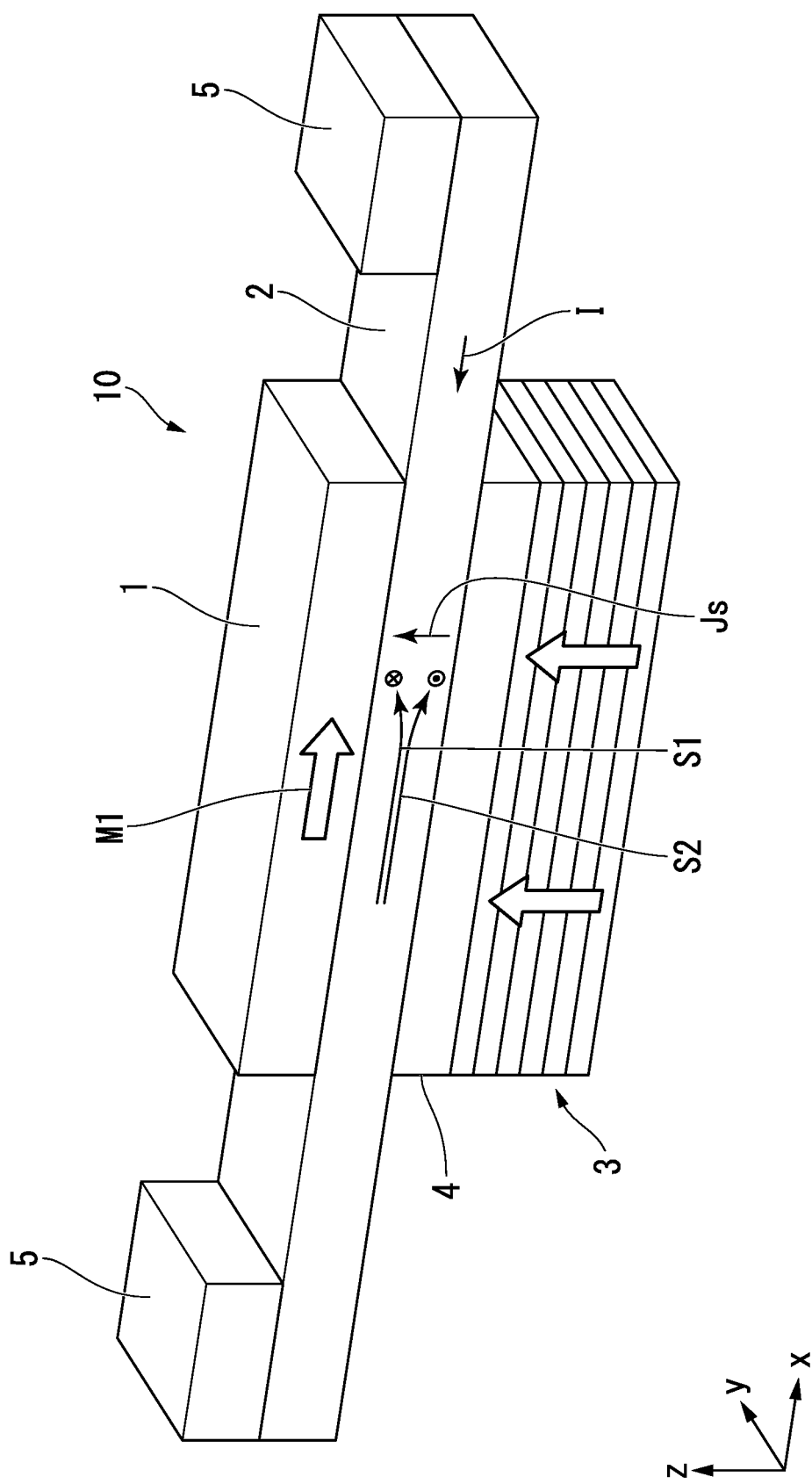
FIG. 1 is a perspective view schematically illustrating a structure of a spin current magnetization rotational element according to a first embodiment.

Hereinafter, the present disclosure will be suitably described in detail with reference to the diagrams. In the drawings used in the following description, in order to make the features of the present disclosure easier to understand, characteristic portions may be illustrated in an enlarged manner for the sake of convenience, and the dimensional proportions of each constituent element may be different from actual ones. The materials, dimensions, and the like exemplified in the following description are merely examples. The present disclosure is not limited thereto and can be realized by suitable changes within a range in which the effects of the present disclosure are exhibited.

First Embodiment

FIG. 1 is a perspective view schematically illustrating a spin current magnetization rotational element according to a first embodiment.

A spin current magnetization rotational element 10 according to the first embodiment has a first ferromagnetic layer 1, a spin-orbit torque wiring 2, and a first perpendicular magnetic field applying layer 3. In the form of FIG. 1, the first ferromagnetic layer 1 having a rectangular shape in a plan view and having the same width as the spin-orbit torque wiring 2 is laminated on a middle part on an upper surface of the belt-shaped spin-orbit torque wiring 2. The first perpendicular magnetic field applying layer 3 is formed via an insulating layer 4 on a middle side on a lower surface of the spin-orbit torque wiring 2. In addition, electrode layers 5 are formed at both end parts on the upper surface of the spin-orbit torque wiring 2. In the form of FIG. 1, the first perpendicular magnetic field applying layer 3 is formed to have a width and a length equal to those of the first ferromagnetic layer 1 in a plan view.

Hereinafter, description will be given while defining a first direction in which the spin-orbit torque wiring 2 extends as an x-direction; a lamination direction (second direction) of the first ferromagnetic layer 1 orthogonal to the x-direction, with respect to the spin-orbit torque wiring 2 as a z-direction; and a third direction that is an in-plane direction in which the spin-orbit torque wiring 2 extends, and is orthogonal to the first direction as a y-direction.

<First Ferromagnetic Layer>

The first ferromagnetic layer 1 functions when the orientation of its magnetization relatively changes.

As a material of the first ferromagnetic layer 1, a ferromagnetic material, particularly a soft-magnetic material can be applied. For example, it is possible to use a metal selected from the group consisting of Cr, Mn, Co, Fe, and Ni, an alloy containing one or more kinds of the metals, and an alloy containing the metals and at least one element from B, C, and N. Specifically, Co—Fe, Co—Fe—B, and Ni—Fe can be exemplified.

<Spin-Orbit Torque Wiring>

The spin-orbit torque wiring 2 extends in the x-direction. The spin-orbit torque wiring 2 is connected to one surface of the first ferromagnetic layer 1 in the z-direction. The spin-orbit torque wiring 2 may be directly connected to the first ferromagnetic layer 1 or may be connected thereto via a different layer such as a cap layer.

The spin-orbit torque wiring 2 is formed of a material in which a pure spin current is generated due to a spin Hall effect when a current flows. The material need only have a configuration in which a pure spin current is generated in the spin-orbit torque wiring 2. Therefore, the material is not limited to a material consisting of a single chemical element. The spin-orbit torque wiring 2 may be constituted of a portion formed of a material which generates a pure spin current and a portion formed of a material with which a pure spin current is not generated.

The spin Hall effect is a phenomenon in which a pure spin current is induced in a direction orthogonal to the orientation of a current based on spin orbit interaction when a current flows in the material. A mechanism in which a pure spin current is generated due to the spin Hall effect will be described.

As illustrated in FIG. 1, when a potential difference is applied to both ends of the spin-orbit torque wiring 2 in the x-direction, a current I flows along the x-direction. When the current I flows, each of a first spin S1 oriented to the far side in the paper (in the y-direction in FIG. 1) and a second spin S2 oriented to the user's side in the paper (in the negative y-direction in FIG. 1) is bent in a direction orthogonal to the current. An ordinary Hall effect and the spin Hall effect are in common with each other in that a motion (movement) direction of electric charge (electrons) making a motion (movement) is bent. However, in the ordinary Hall effect, a charged particle making a motion in a magnetic field receives a Lorentz force and its motion direction is bent. In contrast, the spin Hall effect is significantly different therefrom in that the movement direction is bent when electrons move only (a current flows only) even if no magnetic field is present.

In a nonmagnetic material (material which is not a ferromagnetic material), the number of electrons of the first spin S1 and the number of electrons of the second spin S2 are equal to each other. Accordingly, in the diagram, the number of electrons of the first spin S1 oriented in an upward direction and the number of electrons of the second spin S2 oriented in a downward direction are equal to each other. Therefore, the current as a net flow of electric charge is zero. A spin current which is not accompanied by a current is particularly called a pure spin current.

When a current flows in a ferromagnetic material, the first spin S1 and the second spin S2 are bent in directions opposite to each other in the same manner. On the other hand, in a ferromagnetic material, any of the first spin S1 and the second spin S2 is in a state in which there is a greater amount thereof. As a result, this is different in that a net flow of electric charge is caused (a voltage is generated). Therefore, a material of the spin-orbit torque wiring 2 does not include a material constituted of only a ferromagnetic material.

Here, when a flow of electrons of the first spin S1 is expressed as $J_\uparrow$, a flow of electrons of the second spin S2 is expressed as $J_\downarrow$, and a spin current is expressed as $J_S$, the relationship therebetween is defined as $J_S=J_\uparrow-J_\downarrow$. In FIG. 1, $J_S$ as a pure spin current flows in the upward direction in the diagram. Here, $J_S$ is a flow of electrons in which the polarizability is 100%.

In FIG. 1, when a ferromagnetic material is brought into contact with the upper surface of the spin-orbit torque wiring 2, a pure spin current diffuses and flows into the ferromagnetic material. That is, a spin is injected into the first ferromagnetic layer 1.

As a material of a spin-orbit torque wiring, it is possible to use a material selected from the group consisting of tungsten, rhenium, osmium, iridium, and an alloy containing at least one of the metals. In addition, tungsten, rhenium, osmium, and iridium have 5$d$ electrons in the outermost shell and have a large orbital angular momentum when five d-orbitals are degenerated. Therefore, the spin orbit interaction causing the spin Hall effect increases, so that a spin current can be efficiently generated.

The spin-orbit torque wiring 2 may contain a nonmagnetic heavy metal. Here, a heavy metal is used in the meaning of a metal having specific gravity equal to or higher than that of yttrium. The spin-orbit torque wiring 2 may be formed of only a nonmagnetic heavy metal.

In this case, it is preferable that a nonmagnetic heavy metal be a nonmagnetic metal of a high atomic number, that is, the atomic number 39 or higher having d-electrons or f-electrons in the outermost shell. The reason for this is that such a nonmagnetic metal has significant spin orbit interaction causing the spin Hall effect. The spin-orbit torque wiring 2 may be formed of only a nonmagnetic metal of a high atomic number, that is, the atomic number 39 or higher having d-electrons or f-electrons in the outermost shell.

For example, when a low resistance part constituting a portion of a connection wiring for carrying a current to the spin-orbit torque wiring 2 consists of Cu (1.7 μΩcm), examples of a material of which the atomic number is 39 or higher and electric resistivity is twice or higher than that of Cu include Y, Zr, Nb, Mo, Ru, Pd, Cd, La, Hf, Ta, W, Re, Os, Ir, Pt, Hg, Ce, Pr, Nd, Sm, Eu, Gd, Tb, Dy, Ho, Er, Tm, Yb, and Lu.

Normally, when a current flows in a metal, all the electrons move in a direction opposite to that of the current regardless of the orientation of its spin. In contrast, since a nonmagnetic metal of a high atomic number having d-electrons or f-electrons in the outermost shell has significant spin orbit interaction, a direction in which electrons move due to the spin Hall effect depends on the orientation of an electron spin, so that the pure spin current JS is easily generated. Particularly, when Ir is used as a nonmagnetic heavy metal, the spin Hall effect increases. Moreover, it is possible to apply perpendicular magnetic anisotropy greater than that of a material in the related art to the first ferromagnetic layer 1, at the interface between Ir and the first ferromagnetic layer 1.

In addition, the spin-orbit torque wiring 2 may contain a magnetic metal. A magnetic metal indicates a ferromagnetic metal or an antiferromagnetic metal. The reason for this is that when a nonmagnetic metal contains a very small amount of magnetic metal, the spin orbit interaction is strengthened, so that the efficiency of generating a spin current with respect to a current flowing in the spin-orbit torque wiring 2 can be enhanced. The spin-orbit torque wiring 2 may be formed of only an antiferromagnetic metal.

The spin orbit interaction is caused due to the unique internal magnetic field of the substance in the material of the spin-orbit torque wiring.

Therefore, a pure spin current is caused even in a nonmagnetic material. When a very small amount of magnetic metal is added to the material of the spin-orbit torque wiring, the magnetic metal itself scatters the spin of flowing electrons. Accordingly, the efficiency of generating a spin current is improved. However, if the added amount of magnetic metal excessively increases, a generated pure spin current is scattered by the added magnetic metal. As a result, an operation of reducing a spin current becomes stronger.

Therefore, it is preferable that the molar ratio of a magnetic metal to be added be sufficiently smaller than the molar ratio of a main component of a pure spin generation part in the spin-orbit torque wiring. As a guide, it is preferable that the molar ratio of a magnetic metal to be added be 3% or lower.

In addition, the spin-orbit torque wiring 2 may include a topological insulator. The spin-orbit torque wiring 2 may be constituted of only a topological insulator. A topological insulator is a substance in which the inside of the substance is an insulator or a high resistance material but a spin-polarized metal state is provided on its surface. The substance has an internal magnetic field such as spin orbit interaction.

Therefore, even if there is no external magnetic field, a new topological phase is manifested due to the effect of the spin orbit interaction. This is a topological insulator, and a pure spin current can be generated in a highly efficient manner due to the strong spin orbit interaction and collapse of the rotational symmetry at the edge.

For example, as a topological insulator, it is preferable to use SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, or the like. Topological insulators can generate a spin current in a highly efficient manner.

<First Perpendicular Magnetic Field Applying Layer>

The first perpendicular magnetic field applying layer 3 is provided to apply a perpendicular magnetic field having a component in the z-direction in FIG. 1 to the first ferromagnetic layer 1.

In the form of FIG. 1, the first perpendicular magnetic field applying layer 3 is constituted of a multilayer film of ferromagnetic materials having a strong holding force. For example, the first perpendicular magnetic field applying layer 3 is constituted of a CoNi multilayer film or a CoPt multilayer film.

Furthermore, it is possible to use any of a magnetic material exhibiting a perpendicular magnetization (an alloy of FePt, FePd, and the like; and an alloy of rare earth elements such as GdCo and TbFeCo, and a transition metal), and a magnetic material exhibiting an effect of perpendicular magnetic anisotropy derived through the interface (Co, Fe, CoFe, Ni, and CoNi). For example, it is possible to employ a magnetic semiconductor material, for example, a non-metal magnetic material such as GaMnAs (that is, Mn-doped GaAs).

Since the first perpendicular magnetic field applying layer 3 is provided below the spin-orbit torque wiring 2 via the insulating layer 4, the first perpendicular magnetic field applying layer 3 can apply a self-generated perpendicular magnetic field (magnetic field of which the orientation of a magnetization is perpendicular to the film surface of the first ferromagnetic layer 1) to the first ferromagnetic layer 1.

<Insulating Layer>

The insulating layer 4 is provided to cause the spin-orbit torque wiring 2 and the first perpendicular magnetic field applying layer 3 to be electrically separated from each other. If the spin-orbit torque wiring 2 and the first perpendicular magnetic field applying layer 3 are electrically separated from each other, when a current flows in the spin-orbit torque wiring 2, a current also flows in the first perpendicular magnetic field applying layer 3, so that the current density can be prevented from decreasing due to the dispersed current.

Therefore, the spin-orbit torque wiring 2 and the first perpendicular magnetic field applying layer 3 are electrically separated from each other by providing the insulating layer 4.

The spin current magnetization rotational element 10 may have other constituent elements in addition to the first ferromagnetic layer 1, the spin-orbit torque wiring 2, the first perpendicular magnetic field applying layer 3, and the insulating layer 4. For example, a substrate or the like may be included as a supporter. The substrate preferably has excellent flatness. For example, Si or AlTiC can be used as a material.

In addition, the present embodiment is not necessarily limited to the configuration described above, and various changes can be applied thereto within a range not departing from the gist.

(Principle of Spin Current Magnetization Rotational Element)

Next, the principle of the spin current magnetization rotational element 10 will be described, and a reason that the magnetization M1 of the first ferromagnetic layer 1 can perform a magnetization rotation with no magnetic field by being oriented in the x-direction and being slightly inclined from the x-direction due to a perpendicular magnetic field of the first perpendicular magnetic field applying layer 3 will be described.

As illustrated in FIG. 1, when the current I is applied to the spin-orbit torque wiring 2, the first spin S1 and the second spin S2 are bent due to the spin Hall effect. As a result, the pure spin current $J_S$ is caused in the z-direction.

The first ferromagnetic layer 1 is installed in the z-direction of the spin-orbit torque wiring 2. Therefore, a spin is injected into the first ferromagnetic layer 1 from the spin-orbit torque wiring 2. An injected spin applies a spin-orbit torque (SOT) to the magnetization M1 of the first ferromagnetic layer 1, so that a magnetization rotation is caused.

Here, the problem is that whether or not an infused spin can apply energy sufficient to cause a magnetization rotation of the magnetization M1.

When no perpendicular magnetic field from the first perpendicular magnetic field applying layer 3 acts, the orientation of the magnetization M1 in the first ferromagnetic layer 1 is aligned toward the x-direction. Therefore, even if an SOT is applied, the magnetization in the first ferromagnetic layer 1 can rotate only 90°, so that a magnetization rotation can only be caused in a probabilistic manner. On the other hand, when a perpendicular magnetic field from the first perpendicular magnetic field applying layer 3 acts, the magnetization M1 is inclined in a direction slightly misaligned from the x-direction. As a result, rotational probability of a magnetization which has rotated 90° due to an SOT becomes asymmetric. As a result, the magnetization M1 can cause a magnetization rotation with low energy.

As described above, according to the spin current magnetization rotational element 10 of the first embodiment, since the first perpendicular magnetic field applying layer 3 is included inside the element, even though an external force such as an external magnetic field is not applied, the magnetization M1 of the first ferromagnetic layer 1 (free layer) can cause a rotation. The reason for this is that the magnetization M1 has inclined in the z-direction in response to an applied perpendicular magnetization.

According to the spin current magnetization rotational element 10, a wiring for applying a magnetic field to cause the magnetization M1 to be inclined is no longer necessary. Therefore, it is possible to provide a configuration in which a magnetization rotation can be made by carrying a current to the spin-orbit torque wiring 2 without increasing the consumption of electricity. In addition, a wiring for applying a magnetic field to cause the magnetization M1 to be inclined is no longer necessary. Therefore, it is possible to provide the spin current magnetization rotational element 10 in which deterioration in degree of integration is not caused and the production cost is not increased.

The spin current magnetization rotational element 10 according to the first embodiment described above can be applied to a nonvolatile magnetic random access memory (MRAM), a high-frequency component, a magnetic sensor, or the like.

Second Embodiment

<Magnetoresistance Effect Element>

Figure 2:
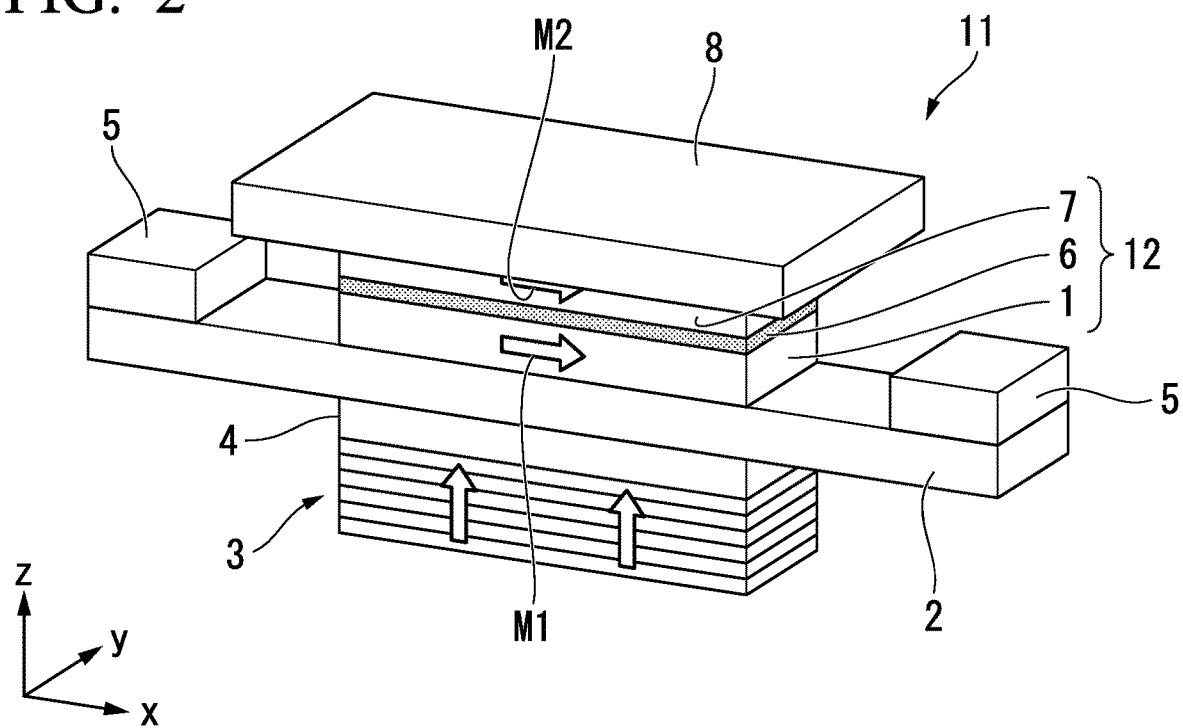
FIG. 2 is a perspective view schematically illustrating a structure of a second embodiment in which the same spin current magnetization rotational element is applied to a magnetoresistance effect element.

FIG. 2 illustrates a second embodiment configuring a magnetoresistance effect element 11 by using the spin current magnetization rotational element 10 of the first embodiment. The magnetoresistance effect element 11 includes a nonmagnetic layer 6 which is laminated above (z-direction) the first ferromagnetic layer 1, and a second ferromagnetic layer 7 which is laminated above (z-direction) the nonmagnetic layer 6. An electrode layer 8 is provided above the second ferromagnetic layer 7. Other configurations are equal to those of the spin current magnetization rotational element 10 of the first embodiment. The magnetoresistance effect element 11 has the first ferromagnetic layer 1, the spin-orbit torque wiring 2, the first perpendicular magnetic field applying layer 3, the insulating layer 4, and the electrode layers 5. In the magnetoresistance effect element 11, a magnetoresistance effect element core unit 12 is constituted of a laminated body including the first ferromagnetic layer 1, the nonmagnetic layer 6, and the second ferromagnetic layer 7.

In the magnetoresistance effect element 11, for example, a first power supply (not illustrated) for supplying electricity to the spin-orbit torque wiring 2 is connected to the electrode layers 5 and 5. A second power supply for supplying a current in the lamination direction of the first ferromagnetic layer 1, the nonmagnetic layer 6, and the second ferromagnetic layer 7 is connected to the electrode layers 5 and 8.

The magnetoresistance effect element 11 functions when a magnetization M2 of the second ferromagnetic layer 7 is fixed in one direction (x-direction) and the orientation of the magnetization M1 of the first ferromagnetic layer 1 relatively changes. When being applied to a coercivity-differed type (pseudo spin valve type) MRAM, the coercivity of the second ferromagnetic layer 7 is greater than the coercivity of the first ferromagnetic layer 1. In addition, when being applied to an exchange bias type (spin valve type) MRAM, a magnetization direction of the second ferromagnetic layer 7 is fixed due to exchange bonding with respect to an antiferromagnetic layer.

In addition, the magnetoresistance effect element 11 is a tunneling magnetoresistance (TMR) element when the nonmagnetic layer 6 is constituted of an insulator, and the magnetoresistance effect element 11 is a giant magnetoresistance (GMR) element when the nonmagnetic layer 6 is constituted of a metal.

A known lamination configuration of a magnetoresistance effect element can be employed as the lamination configuration of the magnetoresistance effect element 11. For example, each of the layers may be constituted of a plurality of layers or may include a different layer such as an antiferromagnetic layer for fixing a magnetization direction of the second ferromagnetic layer 7. The second ferromagnetic layer 7 is called a fixed layer or a reference layer, and the first ferromagnetic layer 1 is called a free layer or a storage layer.

A known material can be used as a material of the second ferromagnetic layer 7. For example, it is possible to use a metal selected from the group consisting of Cr, Mn, Co, Fe, and Ni, and an alloy containing one or more kinds of the metals and exhibiting ferromagnetism. It is also possible to use an alloy containing the metals, and at least one element from B, C, and N. Specifically, Co—Fe and Co—Fe—B are included as examples.

In addition, in order to obtain a higher output, it is preferable that a Heusler alloy such as $Co_2FeSi$ be used as a material of the second ferromagnetic layer 7. A Heusler alloy contains an intermetallic compound having a chemical composition of $X_2YZ$, in which X is a transition metal element of group Co, Fe, Ni, or Cu, or a noble metal element on the periodic table; Y is a transition metal of group Mn, V, Cr, or Ti, or the kinds of chemical elements of X; and Z is a typical element of group III to group V. For example, $Co_2FeSi$, $Co_2MnSi$, and $Co_2Mn_{1-a}Fe_aAl_bSi_{1-b}$ are included.

In order to further increase the coercivity of the second ferromagnetic layer 7 with respect to the first ferromagnetic layer 1, an antiferromagnetic material such as IrMn and PtMn may be used as a material to be in contact with the second ferromagnetic layer 7. Moreover, in order to prevent the first ferromagnetic layer 1 from being affected by a leakage magnetic field of the second ferromagnetic layer 7, it is possible to have a structure of synthetic ferromagnetic bonding.

A known material can be used as the nonmagnetic layer 6.

For example, when the nonmagnetic layer 6 is constituted of an insulator (when being a tunnel barrier layer), $Al2O3$, $SiO2$, $MgO$, $MgAl2O4$, or the like can be used as its material. In addition to those materials, a material in which a part of Al, Si, or Mg is replaced with Zn, Be, or the like can be used. Among these, $MgO$ and $MgAl2O4$ are materials which can realize a coherent tunnel, a spin can be efficiently infused.

When the nonmagnetic layer 6 is constituted of a metal, Cu, Au, Ag, or the like can be used as its material.

The magnetoresistance effect element 11 may have a different layer. For example, the functional part may have a base layer on a surface of the first ferromagnetic layer 1 on a side opposite to the nonmagnetic layer 6 or may have a cap layer on a surface of the second ferromagnetic layer 7 on a side opposite to the nonmagnetic layer 6.

It is preferable that a spin propagated from the spin-orbit torque wiring 2 be not dispersed in a layer installed between the spin-orbit torque wiring 2 and the first ferromagnetic layer 1. For example, in silver, copper, magnesium, and aluminum, it is known that the spin diffusion length is long (100 nm or longer) and it is difficult for a spin to be dispersed.

In addition, it is preferable that the thickness of this layer be equal to or smaller than the spin diffusion length of a substance constituting the layer.

If the thickness of a layer is equal to or smaller than the spin diffusion length, a spin propagated from the spin-orbit torque wiring 2 can be sufficiently transferred to the first ferromagnetic layer 1.

In addition, in the structure illustrated in FIG. 2, when the first power supply is connected to the spin-orbit torque wiring 2, a current flowing in the spin-orbit torque wiring 2 can be controlled. When the second power supply is connected to the electrode layers 5 and 8, a current flowing in a thickness direction of the magnetoresistance effect element core unit 12 can be controlled. A writing operation is performed when a current flows along the spin-orbit torque wiring 2, and a reading operation is performed when a current flows in the lamination direction of the magnetoresistance effect element core unit 12.

In regard to other operational effects, it is possible to achieve effects similar to those of the first embodiment.

Third Embodiment

Figure 3:
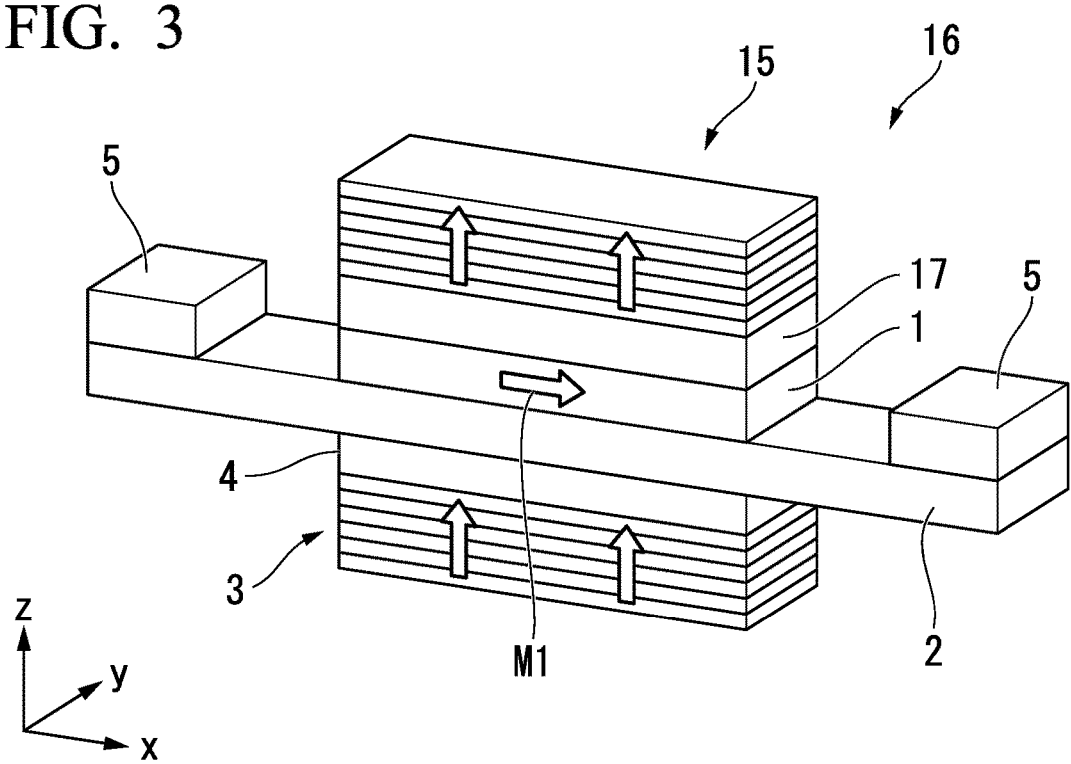
FIG. 3 is a perspective view schematically illustrating a structure of a spin current magnetization rotational element according to a third embodiment.

FIG. 3 illustrates a spin current magnetization rotational element 16 of a third embodiment having a configuration in which a second perpendicular magnetic field applying layer 15 is provided in the spin current magnetization rotational element 10 according to the first embodiment and a perpendicular magnetic field applied to the first ferromagnetic layer 1 is uniformized.

The structure of the third embodiment is characterized in that the second perpendicular magnetic field applying layer 15 is provided above (z-direction) the first ferromagnetic layer 1 via an insulating layer 17.

Other portions in the structure are equal to those in the structure of the first embodiment. The spin current magnetization rotational element 16 has the first ferromagnetic layer 1, the spin-orbit torque wiring 2, the first perpendicular magnetic field applying layer 3, the insulating layer 4, and the electrode layers 5.

The second perpendicular magnetic field applying layer 15 is constituted of a material equal to that of the first perpendicular magnetic field applying layer 3 and is formed to have a width, a length, and a thickness equal to those of the first perpendicular magnetic field applying layer 3. In addition, as its installation position, the second perpendicular magnetic field applying layer 15 is set at a position where the second perpendicular magnetic field applying layer 15 and the first perpendicular magnetic field applying layer 3 can sandwich the first ferromagnetic layer 1 from above and below. In addition, the orientation of a magnetization in the second perpendicular magnetic field applying layer 15 coincides with the orientation of a magnetization in the first perpendicular magnetic field applying layer 3, that is, those are set in the same direction. Here, the orientation of a magnetization in the second perpendicular magnetic field applying layer 15 is not required to completely coincide therewith and need only substantially coincide therewith in order to manifest its function.

In the spin current magnetization rotational element 16 of the third embodiment, the first perpendicular magnetic field applying layer 3 and the second perpendicular magnetic field applying layer 15 are provided such that the first ferromagnetic layer 1 is sandwiched from above and below. Accordingly, the orientation of a magnetization vertically passing through the first ferromagnetic layer 1 can be uniformly aligned.

Consequently, it is possible to equally cause an effect of disrupting the orientation of a magnetization caused in the first ferromagnetic layer 1, at all of the positions in the first ferromagnetic layer 1. In addition, it is possible to control a rotation of a magnetization to be uniformly caused in all of the positions in a surface direction of the first ferromagnetic layer 1.

In regard to other operational effects, it is possible to achieve effects similar to those of the spin current magnetization rotational element 10 of the first embodiment.

Fourth Embodiment

Figure 4:
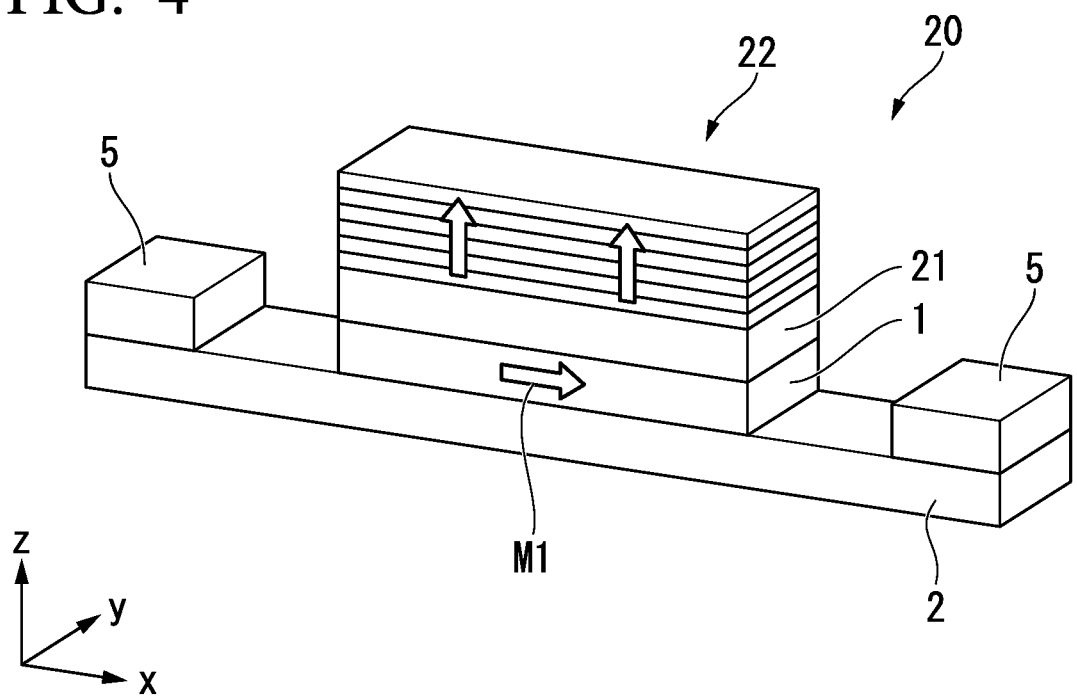
FIG. 4 is a perspective view schematically illustrating a structure of a spin current magnetization rotational element according to a fourth embodiment.

FIG. 4 illustrates a spin current magnetization rotational element 20 of a fourth embodiment. The spin current magnetization rotational element 20 of the fourth embodiment has a structure in which a first perpendicular magnetic field applying layer 22 is provided only above (z-direction) the spin-orbit torque wiring 2 via an insulating layer 21. In the first perpendicular magnetic field applying layer 22, the orientation of a magnetization is orientated upward, so that the orientation of a magnetization caused in the first ferromagnetic layer 1 can be disrupted similarly to the structure of the first embodiment.

Other portions in the structure are equal to those in the structure of the first embodiment. The spin current magnetization rotational element 20 has the first ferromagnetic layer 1, the spin-orbit torque wiring 2, and the electrode layers 5.

The first perpendicular magnetic field applying layer 22 is constituted of a material equal to that of the foregoing embodiment and is formed to have a width, a length, and a thickness equal to those of the first perpendicular magnetic field applying layer 3. In addition, as its installation position, the first perpendicular magnetic field applying layer 22 is formed immediately above the first ferromagnetic layer 1.

Even in the first perpendicular magnetic field applying layer 22, the orientation of a magnetization caused in the first ferromagnetic layer 1 can be disrupted similarly to the first perpendicular magnetic field applying layer 3. Accordingly, it is possible to achieve operational effects equal to those of the spin current magnetization rotational element 10 of the first embodiment.

Fifth Embodiment

Figure 5:
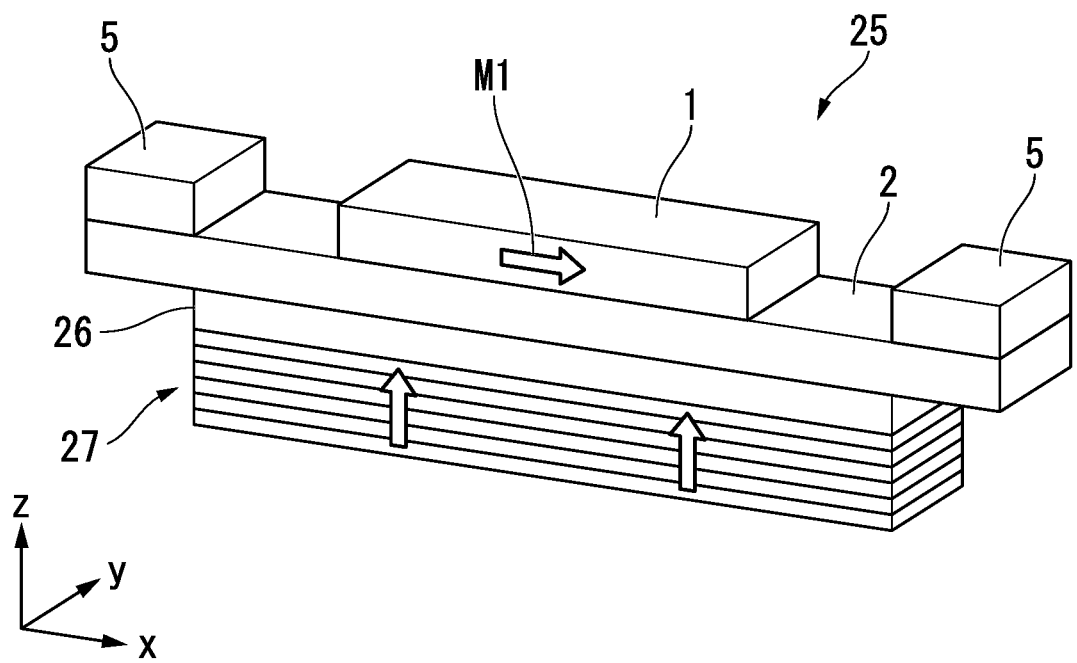
FIG. 5 is a perspective view schematically illustrating a structure of a spin current magnetization rotational element according to a fifth embodiment.

FIG. 5 illustrates a spin current magnetization rotational element 25 of a fifth embodiment. The spin current magnetization rotational element 25 of the fifth embodiment has a structure in which a first perpendicular magnetic field applying layer 27 is provided only below the spin-orbit torque wiring 2 via an insulating layer 26. The spin current magnetization rotational element 25 is characterized in that the first perpendicular magnetic field applying layer 27 is provided to be longer in the x-direction than the first perpendicular magnetic field applying layer 3 of the first embodiment. In this example, end parts of the first perpendicular magnetic field applying layer 27 extend to positions below the end parts of the electrode layers 5, as an example.

In the first perpendicular magnetic field applying layer 27, the orientation of a magnetization caused in the first ferromagnetic layer 1 can be disrupted when the orientation of a magnetization is oriented in the z-direction. The first perpendicular magnetic field applying layer 27 of this embodiment is formed to have a length such that both ends thereof extend to the positions below the electrode layers 5 and is formed to have a width equal to that of the first ferromagnetic layer 1 of the foregoing first embodiment.

Other portions in the structure are equal to those in the structure of the first embodiment. The spin current magnetization rotational element 25 has the first ferromagnetic layer 1, the spin-orbit torque wiring 2, and the electrode layers 5.

The first perpendicular magnetic field applying layer 27 of the fifth embodiment has a surface area larger than that of the first perpendicular magnetic field applying layer 3 of the first embodiment, and the surface area is larger than that of the first ferromagnetic layer 1. Accordingly, a uniform perpendicular magnetic field can be applied to the first ferromagnetic layer 1, and a magnetization rotation of the first ferromagnetic layer 1 can be equally induced in the entire region. Therefore, it is possible to realize a magnetization rotation having high rotational efficiency and being greater than that in the structure of the first embodiment. Here, the surface area denotes the smallest surface when each of the layers is projected in the lamination direction of the first ferromagnetic layer 1 (here, the z-direction) with respect to the spin-orbit torque wiring 2.

Other operational effects are equal to the operational effects which can be obtained in the structure of the first embodiment.

Sixth Embodiment

Figure 6:
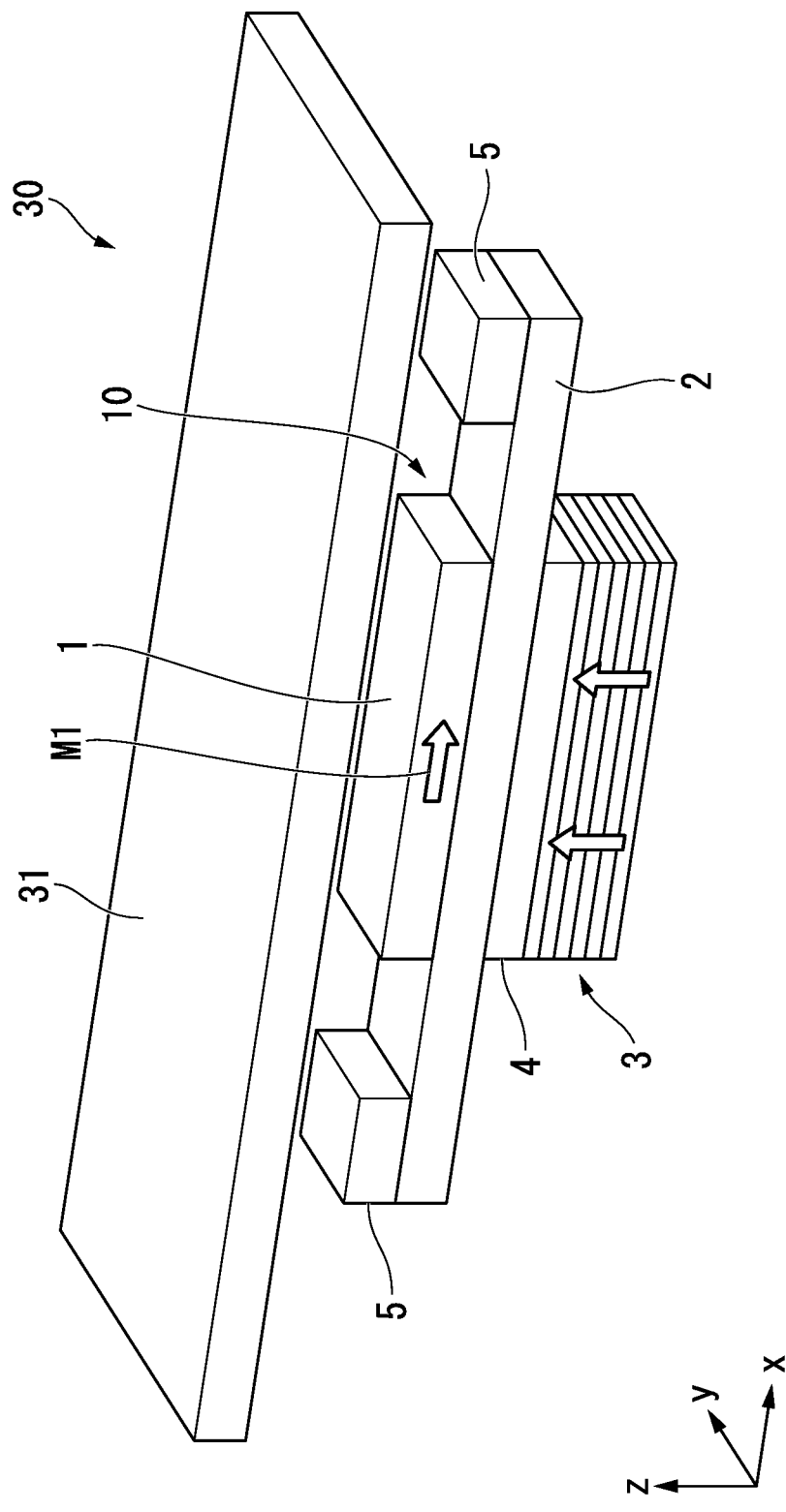
FIG. 6 is a perspective view schematically illustrating a structure of a spin current magnetization rotational element according to a sixth embodiment.

FIG. 6 illustrates a spin current magnetization rotational element 30 of a sixth embodiment. The structure of the spin current magnetization rotational element 30 of the sixth embodiment has a configuration in which a magnetic shield layer 31 is added to the spin current magnetization rotational element 10 of the foregoing first embodiment.

Other configurations are equal to those in the structure of the first embodiment. The spin current magnetization rotational element 30 has the first ferromagnetic layer 1, the spin-orbit torque wiring 2, the electrode layers 5, the first perpendicular magnetic field applying layer 3, and the insulating layer 4.

The magnetic shield layer 31 is formed on the outer side of the first ferromagnetic layer 1 such that the entire upper surface of the spin current magnetization rotational element 10 is covered.

In the first perpendicular magnetic field applying layer 3, the orientation of a magnetization is orientated upward, so that the orientation of a magnetization caused in the first ferromagnetic layer 1 can be disrupted. Meanwhile, a magnetic field generated by the first perpendicular magnetic field applying layer 3 of this embodiment can flow in the magnetic shield layer 31. Accordingly, a uniform magnetic field can be applied to the first ferromagnetic layer 1. Therefore, the structure of the first embodiment can realize a magnetization rotation having high rotational efficiency.

In addition, it is possible to provide the spin current magnetization rotational element 30 which is unlikely to be affected by an external magnetic field, is not affected by a rotation of a spin current due to an external magnetic field, and has excellent stability, by disposing the magnetic shield layer 31.

Other operational effects are equal to the operational effects which can be obtained in the structure of the first embodiment.

Seventh Embodiment

Figure 7:
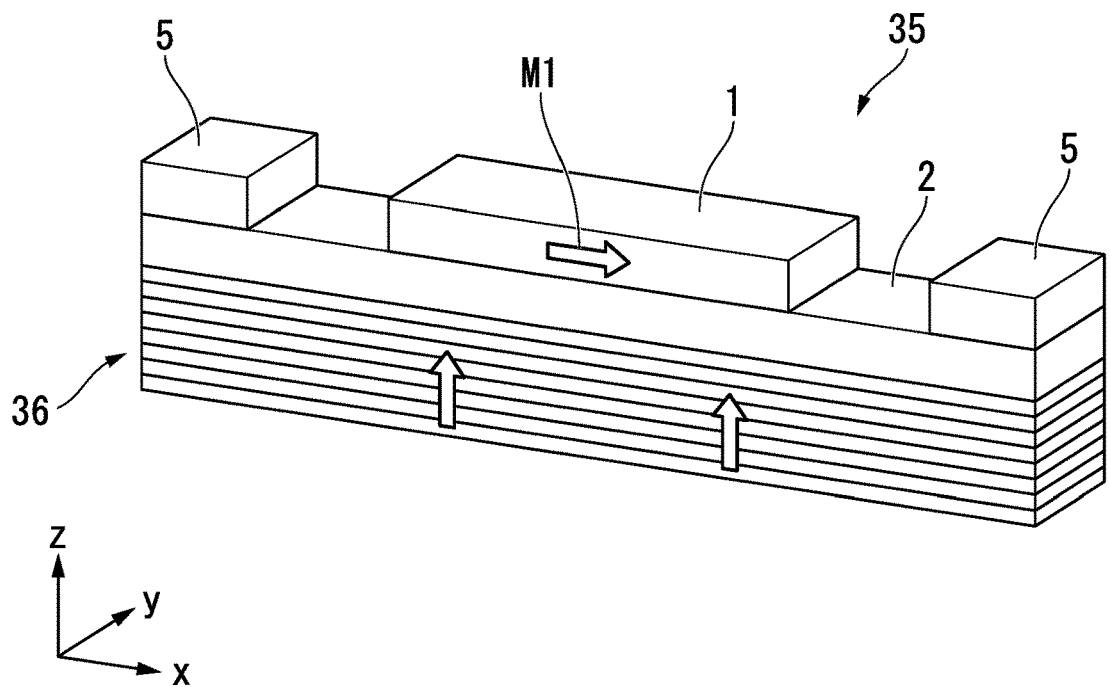
FIG. 7 is a perspective view schematically illustrating a structure of a spin current magnetization rotational element according to a seventh embodiment.

FIG. 7 illustrates a spin current magnetization rotational element 35 of a seventh embodiment. The structure of the spin current magnetization rotational element 35 of the seventh embodiment has a configuration in which the first perpendicular magnetic field applying layers 3 and 27 applied in the foregoing fifth and sixth embodiments are further elongated in the x-direction to have a length corresponding to the entire region of the lower surface of the spin-orbit torque wiring 2. Moreover, no insulating layer is provided, and a first perpendicular magnetic field applying layer 36 is provided to be in direct contact with the lower surface of the spin-orbit torque wiring 2. The first perpendicular magnetic field applying layer 36 is formed at a position where the first perpendicular magnetic field applying layer 36 and the first ferromagnetic layer 1 can sandwich the spin-orbit torque wiring 2.

Other configurations are equal to those in the structure of the first embodiment. The spin current magnetization rotational element 35 has the first ferromagnetic layer 1, the spin-orbit torque wiring 2, and the electrode layers 5.

When the first perpendicular magnetic field applying layer 36 is provided to be in direct contact with the lower surface of the spin-orbit torque wiring 2, if the first perpendicular magnetic field applying layer 36 is constituted of a conductive material, a current flowing in the spin-orbit torque wiring 2 is also distributed to the first perpendicular magnetic field applying layer 36. Consequently, there is concern that the density of a current flowing in the spin-orbit torque wiring 2 may decrease and the aimed spin Hall effect may become sufficient.

Therefore, in the spin current magnetization rotational element 35 illustrated in FIG. 7, the first perpendicular magnetic field applying layer 36 is constituted of an insulating material.

Ferrite or the like can be used as a material capable of generating a perpendicular magnetic field, that is, an insulating material. When forming ferrite, ferrite is formed in a state in which a perpendicular magnetic field is applied to a substrate, so that the formed ferrite layer functions as a perpendicular-magnetization material. In addition, it is preferable that the film thickness of a ferrite layer be 100 nm or thicker. When the film thickness is 100 nm or thicker, even if a dead layer of a ferrite layer surface is present, the effect of ferrite (ferromagnetic material) can be sufficiently conducted. A dead layer is a thin-film layer which exhibits no magnetization in a ferromagnetic material and is caused from an interface in contact with a ferromagnetic layer toward the inner side of the ferromagnetic layer.

It is possible to achieve operational effects similar to those of the foregoing embodiment even in the structure of the seventh embodiment by using the first perpendicular magnetic field applying layer 36 which is an insulating material and is constituted of a material capable of generating a perpendicular magnetic field.

Eighth Embodiment

Figure 8:
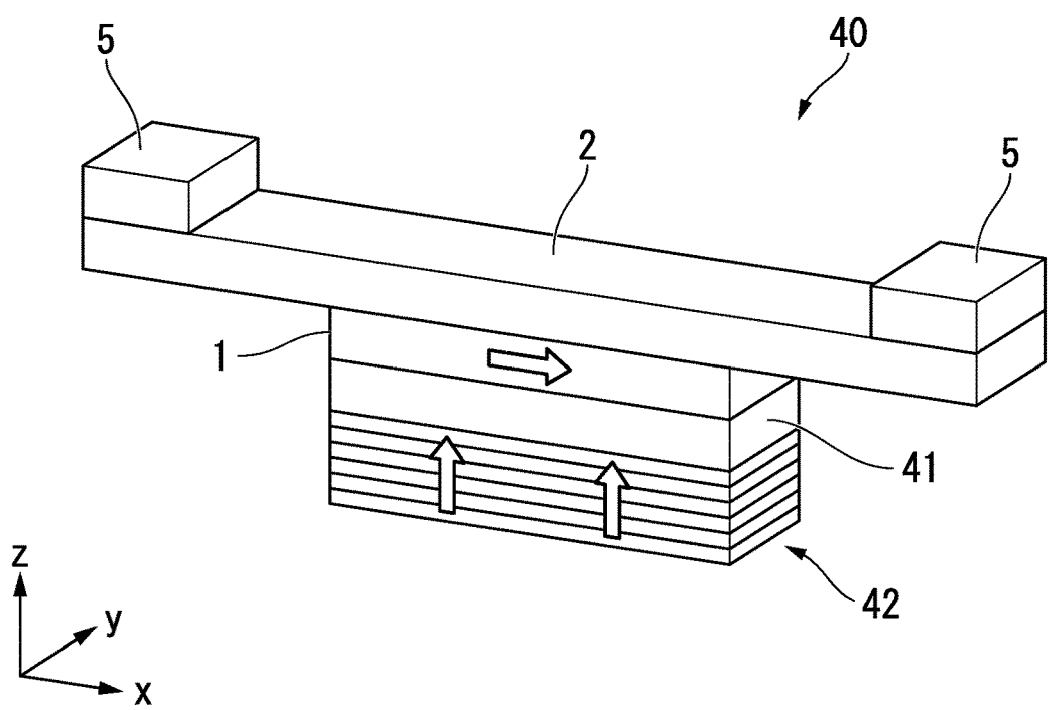
FIG. 8 is a perspective view schematically illustrating a structure of a spin current magnetization rotational element according to an eighth embodiment.

FIG. 8 illustrates a spin current magnetization rotational element 40 according to an eighth embodiment having a structure in which the first ferromagnetic layer 1 is provided below (negative z-direction) the spin-orbit torque wiring 2 and a first perpendicular magnetic field applying layer 42 is provided below thereof via an insulating layer 41.

The structure of the eighth embodiment is characterized in that the first perpendicular magnetic field applying layer 42 is provided below the spin-orbit torque wiring 2 in a state of being electrically separated from the layer thereof.

The spin-orbit torque wiring 2 is the same as the spin-orbit torque wiring 2 applied in the first embodiment, and the first ferromagnetic layer 1 is also the same as the first ferromagnetic layer 1 applied in the first embodiment. Only the formed positions thereof are different from each other.

In the eighth embodiment, when a current is carried to the spin-orbit torque wiring 2, due to the spin Hall effect, a pure spin current can be infused to the first ferromagnetic layer 1 connected to a location therebelow, and a perpendicular magnetic field can be applied to the first ferromagnetic layer 1 from a first perpendicular magnetic field applying layer 43 at all times, thereby exhibiting the effect in which a magnetization rotation can be promoted by causing an aimed disruption in a magnetization the first ferromagnetic layer 1.

In regard to other operational effects, it is possible to achieve operational effects equal to those of the spin current magnetization rotational element 10 of the first embodiment.

In each of the embodiments which have been described so far, the configuration of the spin-orbit torque wiring 2, particularly the structure in which regions are not distinguished has been described. However, in the spin-orbit torque wiring 2, a material which easily generate a pure spin current may be applied to only a region in contact with the first ferromagnetic layer 1, and other regions may be low-resistance wiring parts constituted of a low-resistance metal such as Cu.

A heavy metal which is a material easily generating a pure spin current has higher electric resistance and generates more Joule heat than a metal used as an ordinary wiring. Therefore, heat generation of the spin current magnetization rotational element can be minimized by providing a low-resistance wiring part having low electric resistance.

In the spin-orbit torque wiring 2, a spin current generation part in contact with the first ferromagnetic layer 1 need only be constituted of a material which easily generates a pure spin current as described above.

A material used as an ordinary wiring can be used as the low-resistance wiring part. For example, aluminum, silver, copper, and gold can be used. The low-resistance wiring part need only be constituted of a material having lower electric resistance than the spin current generation part. For example, the low-resistance wiring part may be constituted of multiple types of material portions.

A pure spin current may be generated in the low-resistance wiring part. In addition, in the spin-orbit torque wiring 2, portions other than a main part generating a pure spin current, that is, portions having lower electric resistance than the main part may be distinguished from the spin current generation part as a low-resistance wiring part.

In addition, a spin oriented in the z-direction (second direction) is diffused from the first perpendicular magnetic field applying layer 3 to the spin-orbit torque wiring 2. If the spin-orbit torque wiring 2 is thin, a part of the diffused spin is infused into the first ferromagnetic layer 1. Spin orientations of this infused spin and a spin infused into the first ferromagnetic layer 1 due to a spin current are orthogonal to each other. Therefore, a spin oriented in an oblique direction can be substantially infused into the first ferromagnetic layer 1, so that a magnetization rotation of the first ferromagnetic layer 1 can be easily induced.

Therefore, it is preferable that the value of the film thickness of the spin-orbit torque wiring 2 be smaller than the value of the spin diffusion length of the spin-orbit torque wiring 2.

Production Method

Figure 9:
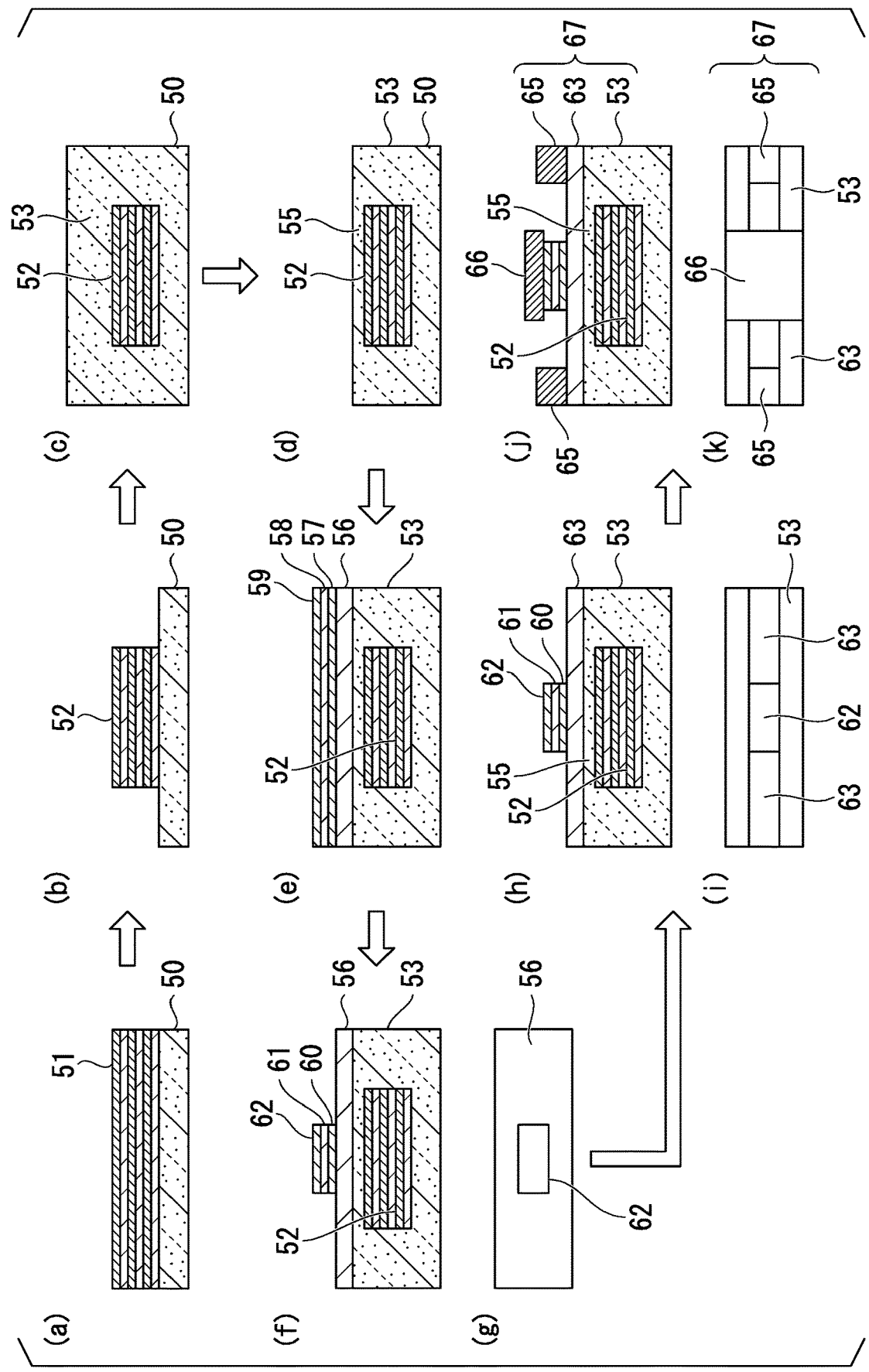
FIG. 9 illustrates an example of a process of producing the magnetoresistance effect element illustrated in FIG. 2.

FIG. 9 is a view describing an overview of an example of a process of producing the magnetoresistance effect element 11 illustrated in FIG. 2.

A plurality of ferromagnetic layers are laminated on an insulating layer 50 consisting of SiOx or SiNx (illustrated in FIG. 9(a)) formed on a substrate (not illustrated) and are subjected to perpendicular magnetization annealing, thereby forming a magnetic layer 51 which becomes a base of the first perpendicular magnetic field applying layer.

As illustrated in FIG. 9(b), a first perpendicular magnetic field applying layer 52 is formed by processing the magnetic layer 51 into a required shape by using a technique such as etching.

As illustrated in FIG. 9(c), an insulating layer 53 consisting of SiOx or SiNx is formed such that the upper surface of the insulating layer 50 and the first perpendicular magnetic field applying layer 52 are surrounded.

As illustrated in FIG. 9(d), the upper surface of the insulating layer 53 is removed as much required in thickness by performing CMP polishing (chemical mechanical polishing), thereby forming an insulating layer 55 having the required thickness on the first perpendicular magnetic field applying layer 52.

As illustrated in FIG. 9(e), a layer 56 which becomes a base of a spin-orbit torque wiring, a layer 57 which becomes a base of a first ferromagnetic layer, a layer 58 which becomes a base of a nonmagnetic layer, and a layer 59 which becomes a base of a second ferromagnetic layer are laminated.

As illustrated in FIGS. 9(f) and 9(g), the layers 57 to 59 are shaped by using a technique such as etching, thereby forming a first ferromagnetic layer 60, a nonmagnetic layer 61, and a second ferromagnetic layer 62.

As illustrated in FIGS. 9(h) and 9(i), a spin-orbit torque wiring 63 is formed and the upper surface is reburied. As illustrated in FIGS. 9(j) and 9(k), an electrode layer 65 is formed on an end part of the spin-orbit torque wiring 63 by forming a contact layer and processing the contact layer into a required shape, thereby forming an electrode layer 66 on a second ferromagnetic layer 61.

Through the process described above, it is possible to produce a magnetoresistance effect element 67 having a structure equal to that of the magnetoresistance effect element illustrated in FIG. 2.

Ninth Embodiment

Figure 10:
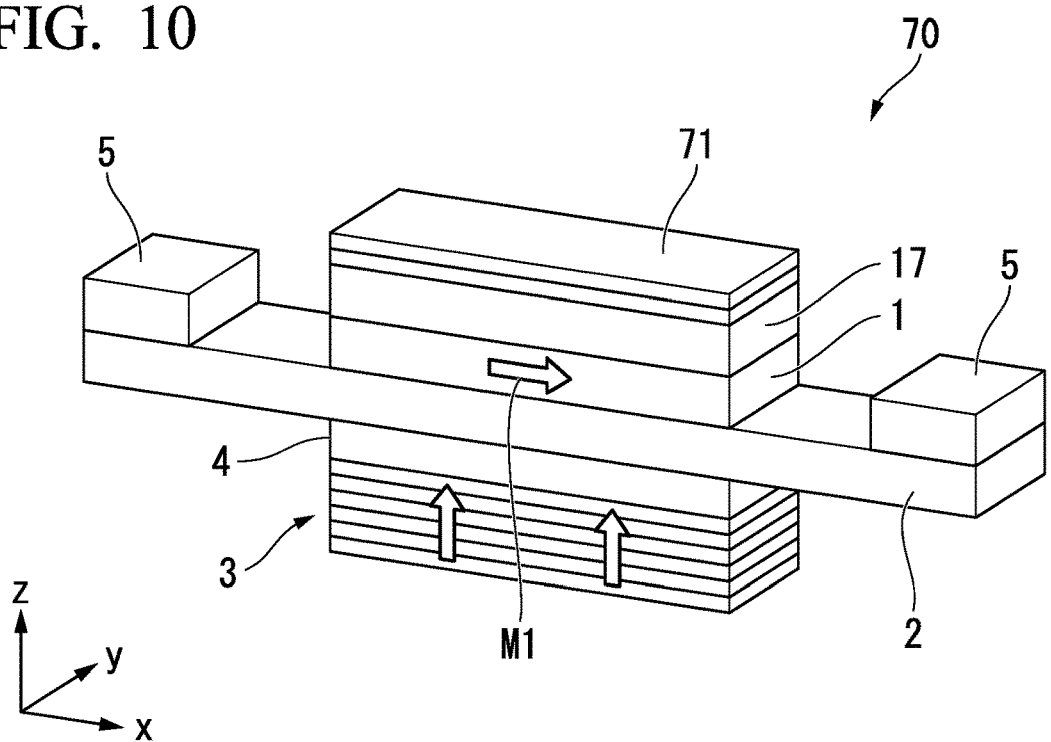
FIG. 10 is a perspective view schematically illustrating a structure of a spin current magnetization rotational element according to a ninth embodiment.

FIG. 10 is a perspective view illustrating an overview of a spin current magnetization rotational element 70 of a ninth embodiment having a structure similar to that of the spin current magnetization rotational element 10 of the third embodiment illustrated in FIG. 3.

Similar to the spin current magnetization rotational element 10 illustrated in FIG. 3, the spin current magnetization rotational element 70 has the first perpendicular magnetic field applying layer 3 and a second perpendicular magnetic field applying layer 71 such that the spin-orbit torque wiring 2 is sandwiched from above and below (along the z-direction). The second perpendicular magnetic field applying layer 71 of this embodiment is characterized by being formed to be thinner than the first perpendicular magnetic field applying layer 3.

Other portions in the structure are equal to those in the structure of the spin current magnetization rotational element 10 of the third embodiment.

In the structure of the ninth embodiment, since the first perpendicular magnetic field applying layer 3 and the second perpendicular magnetic field applying layer 71 are provided such that the spin-orbit torque wiring 2 is sandwiched along the z-direction, a magnetic field can be uniformly and reliably applied in the z-direction. In addition, this structure is characterized in that the second perpendicular magnetic field applying layer 71 is formed to be thinner than the first perpendicular magnetic field applying layer 3, so that the entire thickness occupied by the element can be reduced and the element has excellent integration properties when being integrated.

In addition, for example, in a case of employing a structure in which the second ferromagnetic layer is disposed on the first ferromagnetic layer 1 via a nonmagnetic layer and the second perpendicular magnetic field applying layer 71 is provided thereon, in order to prevent a magnetic field of the second ferromagnetic layer which will serve as a fixed magnetic layer from being affected, it is desirable to weaken the influence of a magnetic field of the second perpendicular magnetic field applying layer 71 with respect to the second ferromagnetic layer, by having the thin second perpendicular magnetic field applying layer 71.

Tenth Embodiment

Figure 11:
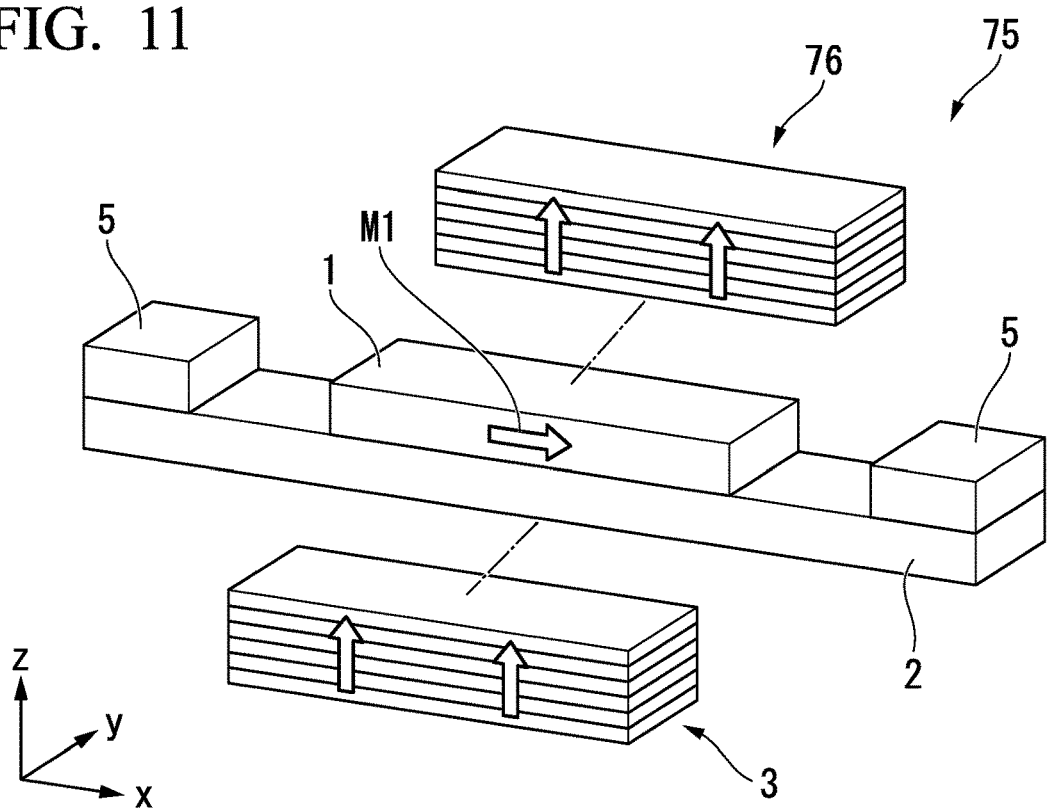
FIG. 11 is a perspective view schematically illustrating a structure of a spin current magnetization rotational element according to a tenth embodiment.

FIG. 11 is a perspective view illustrating an overview of a spin current magnetization rotational element 75 of a tenth embodiment having a structure similar to the spin current magnetization rotational element 16 of the third embodiment illustrated in FIG. 3.

Similar to the spin current magnetization rotational element 16 illustrated in FIG. 3, the spin current magnetization rotational element 75 has the first perpendicular magnetic field applying layer 3 and a second perpendicular magnetic field applying layer 76 such that the spin-orbit torque wiring 2 is sandwiched from above and below. This embodiment is characterized in that the formed positions of the first perpendicular magnetic field applying layer 3 and the second perpendicular magnetic field applying layer 76 positionally misaligned in the y-direction.

That is, the first perpendicular magnetic field applying layer 3 and the second perpendicular magnetic field applying layer 76 are disposed such that the spin-orbit torque wiring 2 is sandwiched obliquely from above and below along the y-direction. In the example of FIG. 11, the first perpendicular magnetic field applying layer 3 is positionally misaligned in the negative y-direction with respect to a location immediately below the first ferromagnetic layer 1, and the second perpendicular magnetic field applying layer 76 is positionally misaligned in the positive y-direction with respect to a location immediately above the first ferromagnetic layer 1.

Other portions in the structure are equal to those in the structure of the spin current magnetization rotational element 10 of the third embodiment.

In the structure of the tenth embodiment, since the first perpendicular magnetic field applying layer 3 and the second perpendicular magnetic field applying layer 76 are provided such that the spin-orbit torque wiring 2 is sandwiched along the y-direction, a magnetic field can be applied in the z-direction, and an orientation of a magnetization inclined in the y-direction can be applied. When a magnetic field in the y-direction (third direction) is applied to a magnetization of the first ferromagnetic layer 1, probability distribution of directions in which a magnetization which has rotated 90° biases becomes more asymmetric, so that the probability of a magnetization rotation is further enhanced.

Magnetic Memory

Figure 12:
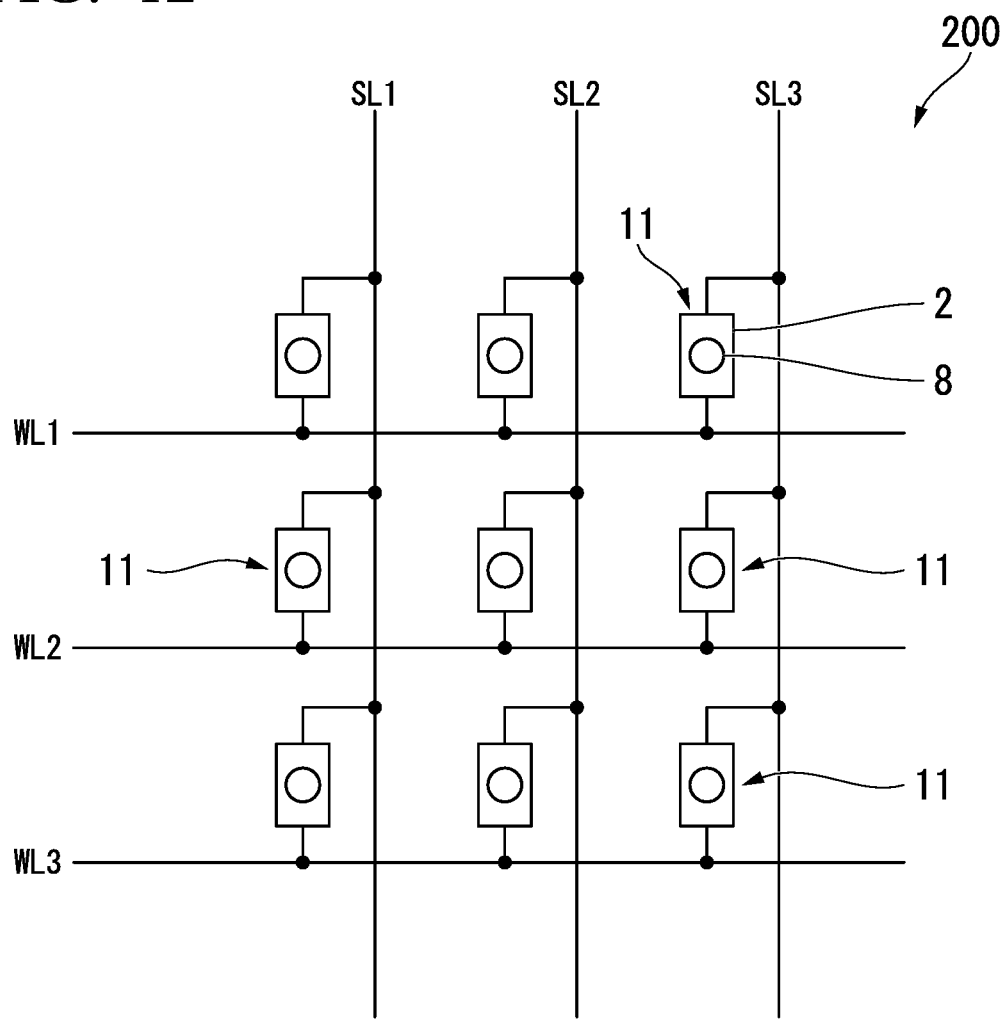
FIG. 12 is a view of a configuration illustrating an example of a magnetic memory including a plurality of spin current magnetization rotational elements according to the present embodiment.

FIG. 12 is a view schematically illustrating a magnetic memory 200 including a plurality of spin current magnetization rotational elements. In the magnetic memory 200 illustrated in FIG. 12, the magnetoresistance effect elements 11 are arranged in matrix of 3×3. FIG. 12 is merely an example of a magnetic memory, and the number and arrangement of the magnetoresistance effect element 11 are arbitrary.

One of word lines WL1 to WL3 and one of source lines SL1 to SL3 are connected to the magnetic memory 200. A current can flow in the spin-orbit torque wiring 2 of an arbitrary magnetoresistance effect element 11 by selecting the word lines WL1 to WL3 and the source lines SL1 to SL3 to which a current is to be applied.

When a current flows in the spin-orbit torque wiring 2, a magnetization of the first ferromagnetic layer 1 of the magnetoresistance effect element 11 rotates due to the SOT effect. In this manner, data can be written in the plurality of magnetoresistance effect elements 11, and data can be read by causing a current to flow in the lamination direction of the plurality of magnetoresistance effect elements 11, so that the magnetoresistance effect elements 11 can be utilized as a memory.

High-Frequency Magnetic Element

Figure 13:
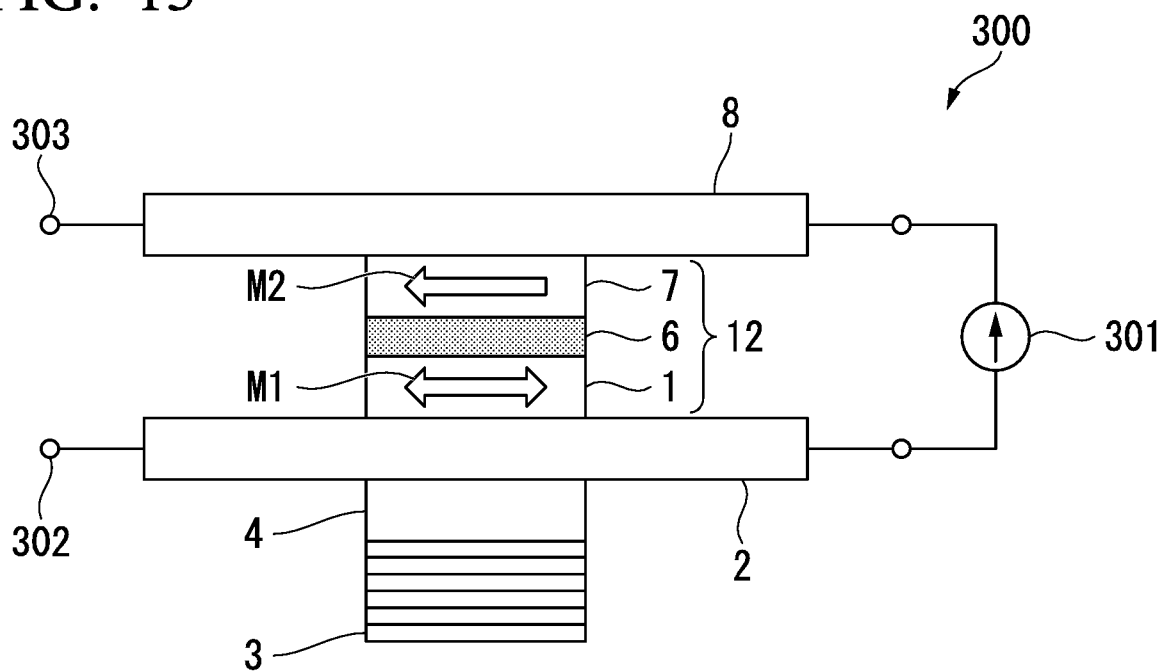
FIG. 13 is a view of a configuration illustrating an example of a high-frequency magnetic element including a plurality of spin current magnetization rotational elements according to the present embodiment.

FIG. 13 is a schematic view of a cross section of a high-frequency magnetic element including the spin current magnetization rotational element according to the present embodiment. A high-frequency magnetic element 300 illustrated in FIG. 13 includes the magnetoresistance effect element 11 illustrated in FIG. 2, and a direct current power supply 301 connected to the magnetoresistance effect element 11.

A high-frequency current is input through an input terminal 302 of the high-frequency magnetic element 300. A high-frequency current generates a high-frequency magnetic field. In addition, when a high-frequency current flows in the spin-orbit torque wiring 2, a pure spin current is induced, and a spin is injected into the first ferromagnetic layer 1. The magnetization M1 of the first ferromagnetic layer 1 vibrates due to a high-frequency magnetic field and an injected spin.

When a frequency of a high-frequency current input through the input terminal 302 is a ferromagnetic resonance frequency, the magnetization M1 of the first ferromagnetic layer 1 resonates in a ferromagnetic manner. When the magnetization M1 of the first ferromagnetic layer 1 resonates in a ferromagnetic manner, a change in resistance value of the magnetoresistance effect element core unit 12 increases. This change in resistance value is read through an output terminal 303 when the direct current power supply 301 applies a direct current or a direct voltage.

That is, when a frequency of a signal input through the input terminal 302 is a ferromagnetic resonance frequency of the magnetization M1 of the first ferromagnetic layer 1, a change in resistance value output through the output terminal 303 increases. When the frequency is a frequency other than that, a change in resistance value output through the output terminal 303 decreases. The high-frequency magnetic element functions as a high-frequency filter by utilizing the degree of this change in resistance value.

In addition, when the first perpendicular magnetic field applying layer 3 applies a magnetic field to the first ferromagnetic layer 1, the magnetization M1 of the first ferromagnetic layer 1 is likely to vibrate. If the magnetization M1 of the first ferromagnetic layer 1 is likely to vibrate, the amount of a change in resistance value increases, and the intensity of a signal output through the output terminal 303 increases.

While preferred embodiments of the disclosure have been described and illustrated above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims.

EXPLANATION OF REFERENCES

1: First ferromagnetic layer
2: Spin-orbit torque wiring
3, 22, 27, 36, 42: First perpendicular magnetic field applying layer
4, 17, 21, 26, 41: Insulating layer
5: Electrode layer
6: Nonmagnetic layer
7: Second ferromagnetic layer
8: Electrode layer
10, 16, 20, 25, 30, 35, 40: Spin current magnetization rotational element
11: Magnetoresistance effect element
12: Magnetoresistance effect element core unit
15: Second perpendicular magnetic field applying layer
31: Magnetic shield layer
52: First perpendicular magnetic field applying layer
60: First ferromagnetic layer
62: Nonmagnetic layer
63: Second ferromagnetic layer
63: Spin-orbit torque wiring

65, 66: Electrode layer
70, 75: Spin current magnetization rotational element
71, 76: Second perpendicular magnetic field applying layer
200: Magnetic memory
300: High-frequency magnetic element

What is claimed is:

1. A spin current magnetization rotational element comprising:
   a spin-orbit torque wiring that extends in a first direction and is configured to generate a spin current;
   a first ferromagnetic layer that is laminated in a second direction, perpendicular to the first direction and intersecting the spin-orbit torque wiring, and is configured to have a magnetization direction which is changeable;
   a first perpendicular magnetic held applying layer that is disposed to be separated from the spin-orbit torque wiring and the first ferromagnetic layer;
   a second perpendicular magnetic field applying layer disposed on a side opposite to a side on which the first perpendicular magnetic field applying layer is disposed with respect to the spin-orbit torque wiring, and an orientation of a magnetization in the first perpendicular magnetic field applying layer and an orientation of a magnetization in the second perpendicular magnetic field applying layer coincide with each other; end
   an insulating layer that is disposed between the spin-orbit torque wiring and the first perpendicular magnetic field applying layer,
   wherein the first perpendicular magnetic field applying layer is configured to apply an assistant magnetic field assisting a magnetization rotation of the first ferromagnetic layer;
   the insulating layer is disposed to come into direct contact with the spin-orbit torque wiring,
   wherein an axis of easy magnetization of the first ferromagnetic layer is in the first direction, and wherein the orientation of magnetization of the first perpendicular magnetic field applying layer is in the second direction, and a magnetic field generated by the first perpendicular magnetic field applying layer has at least a component in the second direction.

2. The spin current magnetization rotational element according to claim 1,
   wherein the first perpendicular magnetic field applying layer is electrically separated from the first ferromagnetic layer.

3. The spin current magnetization rotational element according to claim 1,
   wherein the spin-orbit torque wiring is disposed between the first ferromagnetic layer and the first perpendicular magnetic field applying layer.

4. The spin current magnetization rotational element according to claim 1,
   wherein a value of a film thickness of the spin-orbit torque wiring is a value smaller than a value of a spin diffusion length of the spin-orbit torque wiring.

* * * * *